United States Patent [19]

Dittmer et al.

[11] Patent Number: 5,126,704
[45] Date of Patent: Jun. 30, 1992

[54] POLYPHASE DIVIDER/COMBINER

[75] Inventors: Timothy W. Dittmer; Ralph L. Mortimore, both of Quincy, Ill.

[73] Assignee: Harris Corporation, Melbourne, Fla.

[21] Appl. No.: 683,839

[22] Filed: Apr. 11, 1991

[51] Int. Cl.⁵ .............................................. H01P 5/16
[52] U.S. Cl. ................................... 333/125; 333/128; 333/161; 330/295
[58] Field of Search ............... 333/125, 127, 128, 136, 333/160, 161, 139, 156; 330/286, 295; 342/375

[56]  References Cited
U.S. PATENT DOCUMENTS 3,546,700 12/1970 Rihaczek ...................... 342/375 X
3,974,465  8/1976 White ............................ 333/136 X
4,092,616  5/1978 Osterwalder ...................... 333/125
4,356,462 10/1982 Bowman ............................ 333/128
4,901,042  2/1990 Terakawa et al. ............. 333/128 X Primary Examiner—Paul Gensler
Attorney, Agent, or Firm—Tarolli, Sundheim & Covell

[57] ABSTRACT

A polyphase divider/combiner is provided and which includes a common input/output port and a plurality of N output/input ports, wherein N is an even integer greater than two. N electrical signal transmission paths are provided with each extending from the common input/output port to a respective one of the N output/input ports. The N electrical signal transmission paths are of N different electrical lengths such that the output/input ports are out of phase relative to each other by 180/N degrees.

8 Claims, 2 Drawing Sheets

POLYPHASE DIVIDER/COMBINER

FIELD OF THE INVENTION

The present invention relates to the art of divider/combiner circuits for use in dividing or combining electrical signals.

BACKGROUND OF THE INVENTION

Divider/combiners are known in the art for dividing or combining electrical signals. For example, an RF signal generator may produce a radio frequency signal at a power level on the order of 25 watts and it may be desired that the signal be boosted in power to a level on the order of 1 kw. Solid state power amplifiers may be employed However, there are limitations in the power handling capability of such amplifiers. It is for this reason that it is common to divide the RF signal and apply the divided signals to several paths, each of which includes an RF power amplifier operating at a level of, for example, 1 kw. The amplified RF signals are then combined and supplied to an RF load. The signal dividers and combiners are frequently constructed in the same manner and, hence, are referred to as a divider/combiner.

Divider/combiners capable of performing the function noted above are known in the art. For example, the M. Dydyk U.S. Pat. No. 4,367,445 describes, in its introduction, a divider/combiner known as the Wilkinson device. That device has three ports including a common input/output port and a pair of output/input ports. The output/input ports are electrically connected to the common input/output port by transmission lines wherein each path is of the same electrical length.

It is further known in the prior art to provide N-way divider/combiners based somewhat on the Wilkinson device and which are employed for in-phase operation. As an N-way in-phase divider, an RF signal is supplied to an input port and is split and the split RF signals arrive at the output ports in phase with each other.

It has been known in the prior art to employ such an N-way in-phase divider for supplying RF signals, to be boosted in power, to N RF power amplifiers with the outputs of the power amplifiers being supplied to an N-way in-phase combiner for combining the signals. In this example, the N output ports of the divider are connected to respective inputs of N power amplifiers. Normally, these power amplifiers are designed to operate in a particular system (characteristic) impedance, such as 50 ohms. Any impedance other than this particular impedance will result in a mismatch at the divider output ports. If each has the same mismatch, this will be reflected back from the input of the amplifier through the divider to the common input which is connected to a common RF signal source. Since the transmission lines of the divider are of the same electrical length, the reflected signals will arrive back in-phase with each other and the mismatch from each output port will be additive when the signals arrive at the common input port. This will detract from the efficiency of performance of the system, such as loss of power while generating more heat. A similar situation exists in the opposite direction when employing such circuitry as a combiner.

A quadrature combiner is an N-way combiner, wherein $N=2$, and having 90° phase shift between combined ports. This structure is commonly used for cancellation of uniform mismatches at the combined ports, providing the system (characteristic) impedance.

Given a system comprised of an amplifier and a mismatched load, where the amplifier has a mismatch at its output port, there exists a variation in delivered power to the load as the phase of the load mismatch is varied. This is commonly known as mismatch uncertainty, and is due to the interaction between amplifier output impedance (mismatch) and the impedance (mismatch) of the load being driven.

This same effect occurs when outputs of identical amplifiers are combined in-phase, where the variable phase mismatch is placed on the common port. Each amplifier drives an equivalent impedance (magnitude and phase), thus the "mismatch uncertainty" of delivered power is cumulative.

"Quadrature" combining (using 90° combiners) solves the problem for $N=2$, but for $N>2$ provides no additional advantage in terms of reduced mismatch uncertainty.

The invention herein provides for different electrical lengths to each of N ports (where N is an even integer, greater than two), from the common port. This results in each of N amplifiers driving an impedance which is shifted in phase by $360/N$ degrees from "adjacent" amplifiers. Thus, while each amplifier exhibits the same "mismatch uncertainty" as before, the uncertainty of each amplifier is staggered in phase with respect to the other amplifiers. Thus, while one amplifier is delivering its maximum power, another amplifier is delivering its minimum, and all remaining amplifiers are delivering power between these two extremes. The net effect is that the combined power from all amplifiers is much more independent of phase, remaining relatively constant as the phase of the load mismatch is varied. This reduction in power variation continues to improve as N is increased beyond $N=4$.

Simultaneously, this invention incorporates prior art "quadrature" combiners which provide compensation for uniform impedance mismatches at the N non-common ports. This feature is useful for combining multiple components which exhibit similar impedance mismatches.

SUMMARY OF THE INVENTION

In accordance with one aspect of the present invention, there is provided a polyphase divider/combiner which includes a common input/output port and a plurality of N output/input ports wherein N is an even integer greater than two. N electrical signal transmission paths are provided with each extending from the common input/output port to a respective one of the N output/input ports. The N electrical signal transmission paths are of N different electrical lengths such that the output/input ports are out of phase relative to each other by $180/N$ degrees.

BRIEF DESCRIPTION OF THE DRAWINGS

The foregoing and other features of the invention will become more readily apparent from the following description of the preferred embodiment of the invention as taken in conjunction with the accompanying drawings which are a part hereof and wherein.

DESCRIPTION OF PREFERRED EMBODIMENT

Figure 1:
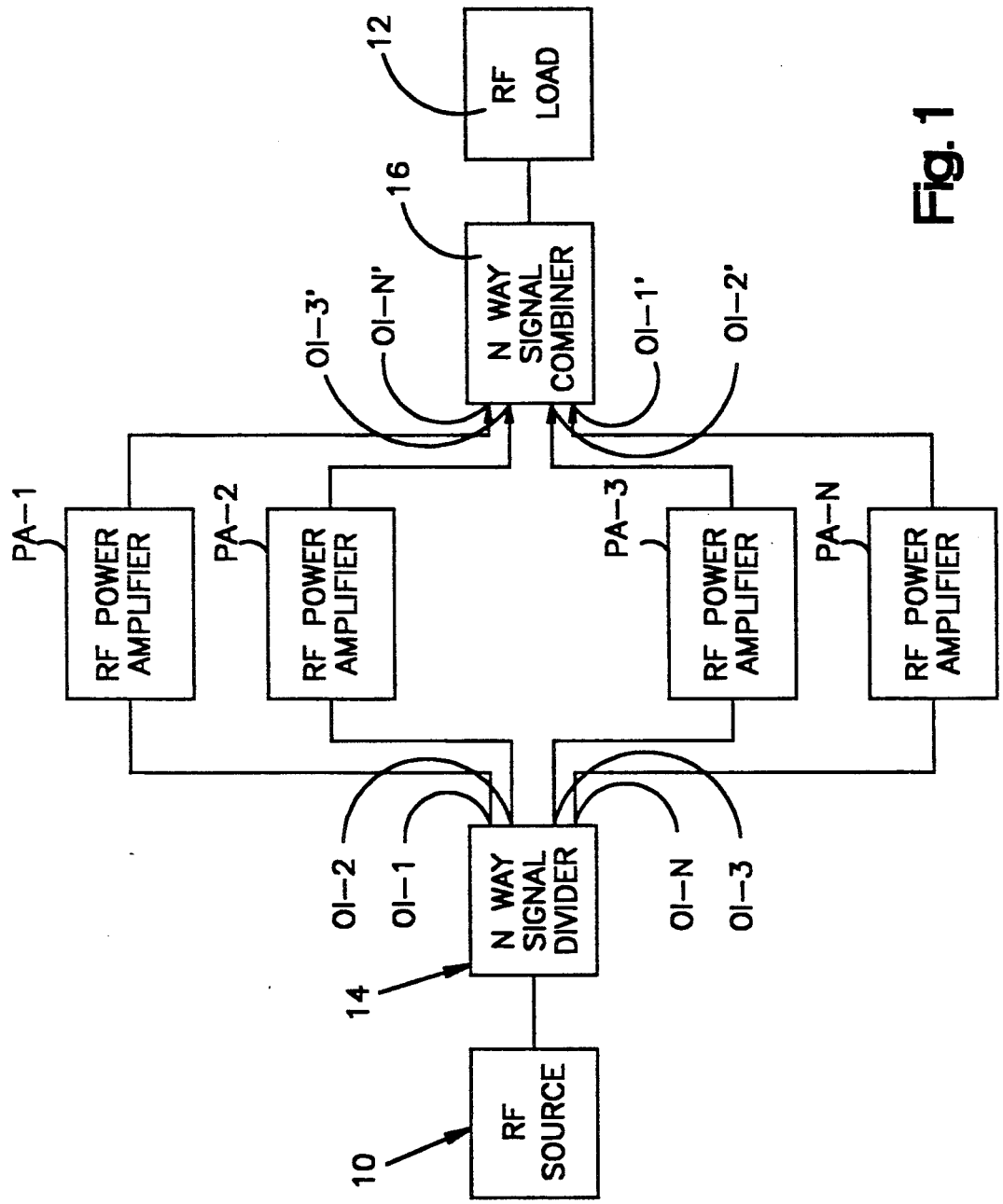
FIG. 1 is a schematic-block diagram illustration of one application of the present invention.

Reference is now made to FIG. 1 which illustrates one application of the present invention in a RF system. Such a system employs an RF source 10 which produces an RF signal at some power level, such as on the order of 25 watts. In the example being presented, it is desirable that the RF signal from source 10 be boosted in power to, for example, 1 kw, before being supplied to an RF load 12. Solid state power amplifiers may be employed for increasing the power level. However, there are limitations in the power handling capability of such amplifiers. It is for this reason that it is common to divide the signal to be amplified and apply the divided signals to several paths, each of which includes an RF power amplifier operating at a level of, for example, 250 watts. The amplified signals are then combined and supplied to the load. Such a system is illustrated in FIG. 1 wherein the output from the RF source 10 is supplied to an N-way signal divider 14 which then divides the signal and applies the divided signals to N paths. The N paths include power amplifiers PA-1 through PA-N. In the example presented herein, N=4 and each power amplifier may boost the power to 250 watts. The amplified signals are then supplied to an N-way signal combiner 16 to produce the final output signal at a power level on the order of 1 kw, which is then applied to the load 12. The signal divider 14 and the signal combiner 16 are each constructed in the same manner. The signal divider/combiner to be described herein can be employed as either a signal divider 14 or as a signal combiner 16.

As will be described hereinafter with respect to FIG. 2, the outputs OI-1 through OI-N of divider 14 are respectively applied to amplifiers PA-1 to PA-N. Also, the outputs of amplifiers PA-1 to PA-N are applied in the reverse order to the combiner inputs OI-1' to OI-N' of the combiner 16.

The signal divider/combiner will be described herein with respect to FIG. 2 as a signal divider 14, it being understood that the circuit may be employed in a reverse manner as a signal combiner 16.

Figure 2:
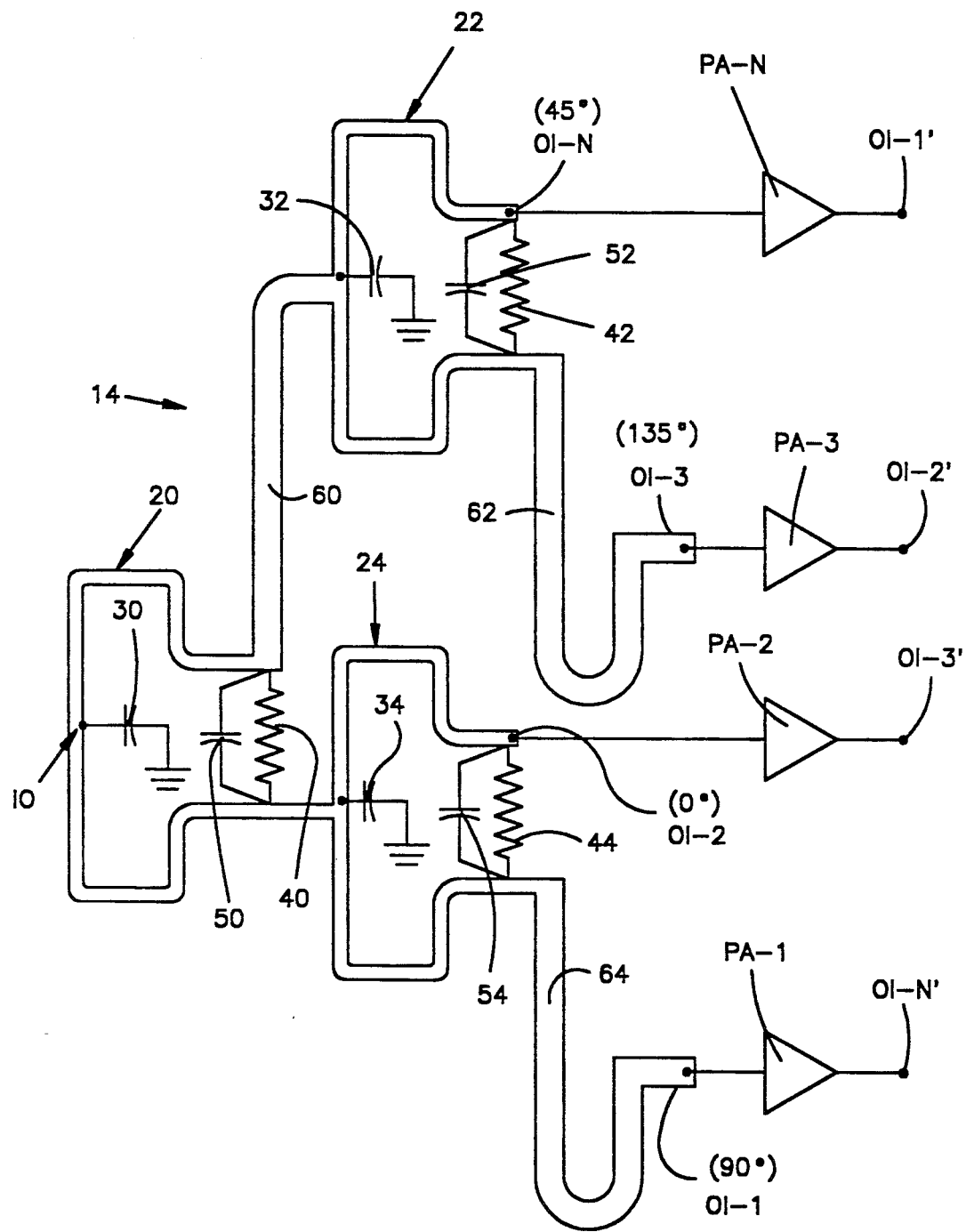
FIG. 2 is a schematic illustration of an electrical circuit diagram of a divider/combiner constructed in accordance with the present invention.

The N-way signal divider 14 is illustrated in FIG. 2 and is implemented in microstrip form. As such, it includes a plurality of transmission lines, each of which takes the form of a conductive metal foil mounted on an insulator which, in turn, overlies a metal layer known as a ground plane. The divider 14 has a common input-/output port IO and N output/input ports OI-1 through OI-N. N is an even integer greater than two. In the example being presented herein, N equals 4. The divider 14 includes an input N/2 way divider and N/2 two-way output dividers. For N=4, divider 14 includes an input two way divider 20 and two, two-way output dividers 22 and 24. Each of these two-way dividers (or combiners) has a common input/output port and a pair of legs extending therefrom by a length on the order of 45° (⅛th wavelength). These high impedance transmission lines are compensated by a capacitance to ground at the common node. These capacitors are capacitors 30, 32 and 34 which respectively connect the common nodes of dividers 20, 22 and 24 to ground. A high impedance resistor, such as on the order of 100 ohms, interconnects the output ports of each divider so as to provide high isolation between the output ports. These isolation resistors include resistors 40, 42 and 44 interconnecting the output ports of the respective dividers 20, 22 and 24. A capacitor is also connected across each isolation resistor to compensate for the effects of foreshortening on the divided port to divided port isolation. These capacitors include capacitors 50, 52 and 54 respectively connected in parallel with resistors 40, 42 and 44.

In the example being presented, each of the dividers 20, 22 and 24 takes the form of what may be considered as a two-way splitter having a single input port and two output ports giving an equal power split of in-phase signals and exhibiting high isolation between the output ports. Moreover, as a combiner, each of these circuits may be reversed and includes two input ports that exhibit high isolation therebetween for receiving in-phase signals and combining these signals at a common output port.

The capacitors 50, 52 and 54 connected in parallel with the 100 ohm isolation resistors 40, 42 and 44 may each exhibit a capacitance of 11.0 pF (picofarads) to enhance isolation between the output ports. This increases the tolerance of non-uniformity in the mismatches at the ports and allows the odd mode (180° out of phase) signal cancellation at each two-way combiner. Also, the capacitors 30, 32 and 34, which connect the common modes of the two-way dividers 20, 22 and 24 to ground may each exhibit a capacitance on the order of 22.0 pF (picofarads). These serve to compensate for the foreshortened transforming sections, allowing quarter-wave transformation without a full quarter-wave line length.

The two-way dividers 20, 22 and 24 are interconnected in such a way as to provide 180/N degrees of phase difference between all of the output (divided) output/input ports OI-1 through OI-N. This is accomplished through the use of low-loss delay lines 60, 62 and 64 which variously "stagger" the phases of all output/input ports OI-1 through OI-N. As will be appreciated from the discussions that follow, this is done to provide compensation for uniformly mismatched output ports, greatly reducing the mismatch at the divided input. This is especially useful in combining applications, where the output impedance of the multiple signal sources may differ significantly from the system characteristic impedance. The delay line 60 interconnects an output port of divider 20 with the common node of divider 22. This delay line 60 provides a delay of 45°. Delay line 62 connected to the lower transmission line leg of divider 22 to the output/input port OI-3 provides a delay of 90°. Similarly, delay line 64 provides a delay of 90°.

From the foregoing, it is seen that the divider 14 in FIG. 2 has N transmission line paths, each extending from the common input/output port IO to a respective one of the N output/input ports OI-1 through OI-N. Moreover, the transmission line paths are of N different electrical lengths, such that the output/input ports are out of phase relative to each other by 180/N degrees. More specifically, a first transmission line path leading from the input/output port IO to the output/input port OI-1 includes the lower transmission line legs of dividers 20 and 24 together with the 90° delay line 64. A second transmission line path includes the lower transmission line leg of divider 20 and the upper transmission line leg of divider 24 leading to the output/input port OI-2. There are no delay lines in this path. A third transmission line path includes the upper transmission line leg of divider 20, the 45° delay line 60, the lower transmission line leg of divider 22 and the 90° delay line 62 leading to the output/input port OI-3. Also, a fourth transmission line path is illustrated in FIG. 2 which includes the upper transmission line leg of divider 20, the 45° delay line 60 and the upper transmission line leg of divider 22 leading to the output/input port OI-N.

An RF signal which is incident on the common input/output port IO encounters different electrical lengths as it traverses through these four paths. The signal arrives at the output/input port OI-2 with a delay that is common to all of the paths and, hence, this may be considered as the zero degree port. The signal arriving at output/input port OI-N arrives 45° after that at port OI-2, and this may be considered as the 45° port. Similarly, the signal arriving at port OI-1 arrives 90° after that at port OI-2 and, hence, this may be considered as the 90° port. Lastly, the signal arriving at port OI-3 arrives 135° after that at port OI-2 and, hence, this may be considered as the 135° port. Consequently, an incident signal applied to the common port is divided four ways and eventually exits through each of the four output ports out of phase with each other by 45°. If each of these output ports sees the same mismatch (same magnitude and phase), the four divided signals would then be reflected back into the four ports OI-1 through OI-N and, thence, back through the transmission line paths and eventually the reflected signals will exit at the common port IO. As each signal has experienced a phase delay differing by 360/N degrees, the reflected signals tend to cancel one another as they meet at the common port IO. This has the overall effect of creating a low return loss at the common port, the desired effect.

FIG. 2 also shows the output ports OI-1 through OI-N being connected to the input of power amplifiers PA-1 through PA-N, respectively. To achieve the proper phase relationship from the outputs of the amplifiers through the N-way signal combiner 16 to its common output port, the circuitry of FIG. 2 needs to be reversed to operate as a combiner. Consequently, the outputs of the amplifier PA-N through PA-1 are supplied in the reverse order to the inputs of the combiners shown as OI-1' through OI-N'. That is, the output of the power amplifier PA-N should be supplied to the 90° input of the combiner and this corresponds with port OI-1 of the circuitry of FIG. 2. This provides a delay of 45° plus 90° for a total delay of 135°. Similarly, if the output of amplifier PA-3 is supplied to the zero degree input corresponding with port OI-2', then the signal in this path will undergo a total delay of 135°. Similarly, if the output of amplifier PA-2 be supplied to the 135° input of the combiner corresponding with port OI-3', this path will also have a total delay of 135°. Lastly, if the output of power amplifier PA-1 be connected to the 45° input corresponding with port OI-N', the total signal delay in this path will be 135°. Thus, the outputs of the power amplifiers PA-1 through PA-N are respectively connected to the ports OI-N', OI-3', OI-2' and OI-1' of the combiner 16.

In summation, the invention herein is directed to a divider (or combiner) having a common input/output port and a plurality of N output/input ports. There are N electrical signal transmission paths, each extending from the common input/output port to a respective one of the N output/input ports. The N paths are of N different electrical lengths so that the output/input ports are out of phase relative to each other by 180/N degrees. This may be implemented with an N/2 way divider together with N/2 two-way output dividers. Delays are inserted between the N/2 way divider and the N/2, two-way dividers with these delays being progressive, starting from 0° delay in steps of 180°/N. Also, one output leg of each of the N/2 two-way dividers may employ an additional delay, such as the 90° delay lines 62 and 64 used in the lower legs of dividers 22 and 24.

Although the invention has been described in conjunction with a preferred embodiment, it is to be appreciated that various modifications may be made without departing from the spirit and scope of the invention as defined by the appended claims.

Having described the invention, the following is claimed:

1. A polyphase divider/combiner comprising:
   a common input/output port;
   a plurality of N output/input ports and wherein N is an even integer greater than two;
   N electrical signal transmission paths, each extending from said common input/output port to a respective one of said N output/input ports;
   said N electrical signal transmission paths being of N different electrical lengths such that the output/input ports are out of phase relative to each other by 180/N degrees.

2. A divider/combiner as set forth in claim 1 including an N/2 way divider/combiner and N/2, two-way divider/combiners.

3. A divider/combiner as set forth in claim 2 wherein said N/2 way divider/combiner has a common node connected in common with said common input/output port and has N/2 electrical branches.

4. A divider/combiner as set forth in claim 3, wherein each of said N/2, two-way divider/combiners has a common node interconnected with a respective one of said electrical branches.

5. A divider/combiner as set forth in claim 4 including N/2−1 delay means interposed between N/2−1 of said branches and N/2−1 of said common nodes of said N/2, two-way dividers/combiners.

6. A divider/combiner as set forth in claim 5 wherein said N/2−1 delay means provide delays each of which is equal to or is a multiple of 180/N degrees.

7. A divider/combiner as set forth in claim 6, wherein each of said N/2, two-way dividers has two electrical branches each interconnected with one of said N output/input ports.

8. A divider/combiner as set forth in claim 7, wherein one of said electrical branches of each of said N/2, two-way dividers includes a delay line exhibiting a delay of 90°.

* * * * *